(12) United States Patent
Ruoff et al.

(10) Patent No.: US 9,639,005 B2
(45) Date of Patent: May 2, 2017

(54) IMAGING CATOPTRIC EUV PROJECTION OPTICAL UNIT

(71) Applicant: Carl Zeiss SMT GmbH, Oberkochen (DE)

(72) Inventors: Johannes Ruoff, Aalen (DE); Thomas Schicketanz, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 288 days.

(21) Appl. No.: 14/179,692

(22) Filed: Feb. 13, 2014

(65) Prior Publication Data
US 2014/0176928 A1   Jun. 26, 2014

Related U.S. Application Data

(63) Continuation of application No. PCT/EP2012/069158, filed on Sep. 28, 2012.
(Continued)

(30) Foreign Application Priority Data

Sep. 30, 2011 (DE) .................. 10 2011 083 888

(51) Int. Cl.
*G03B 27/54* (2006.01)
*G03F 7/20* (2006.01)
*G02B 17/06* (2006.01)

(52) U.S. Cl.
CPC ......... *G03F 7/70233* (2013.01); *G02B 17/06* (2013.01); *G02B 17/0663* (2013.01); *G03F 7/7015* (2013.01); *G03F 7/70566* (2013.01)

(58) Field of Classification Search
CPC ............... G02B 17/06; G02B 17/0647; G02B 17/0663; G03F 7/7015; G03F 7/702;
(Continued)

(56) References Cited

U.S. PATENT DOCUMENTS

| RE40,743 E | 6/2009 | Fuerter et al. |
|---|---|---|
| 2006/0092429 A1 | 5/2006 | Hill |

(Continued)

FOREIGN PATENT DOCUMENTS

| DE | 10 2008 002 749 | 12/2009 |
|---|---|---|
| JP | 2005-129775 A | 5/2005 |

(Continued)

OTHER PUBLICATIONS

International Search Report for corresponding PCT Appl. No. PCT/EP2012/069158, dated Jan. 22, 2013.
(Continued)

*Primary Examiner* — Christina Riddle
(74) *Attorney, Agent, or Firm* — Fish & Richardson P.C.

(57) ABSTRACT

An imaging catoptric optical unit has at least four mirror, which image an object field in an object plane into an image field in an image plane. A first chief ray plane of the optical unit is prescribed by propagation of a chief ray of a central object field point during the reflection at one of the mirrors. A second chief ray plane of the optical unit is prescribed by propagation of the chief ray of the central object field point during the reflection at one of the other mirrors. The two chief ray planes include an angle that differs from 0. In an alternative or additional aspect, the imaging optical unit, considered via the image field, has a maximum diattenuation of 10% or a diattenuation that prefers a tangential polarization of the imaging light for a respectively considered illumination angle. The result of both aspects is an imaging optical unit in which bothersome polarization influences are reduced during the reflection of imaging light at the mirrors of the imaging optical unit.

20 Claims, 12 Drawing Sheets

Related U.S. Application Data

(60) Provisional application No. 61/541,127, filed on Sep. 30, 2011.

(58) Field of Classification Search
CPC ............. G03F 7/70233; G03F 7/70566; G03F 7/70141; G03F 7/70108
USPC ......... 355/45, 50–53, 55, 57, 60, 66–71, 77; 250/492.1, 492.2, 492.22, 493.1, 548; 359/351, 364–366, 846, 850, 857, 858, 359/859, 861
See application file for complete search history.

(56) References Cited

U.S. PATENT DOCUMENTS

| | | |
|---|---|---|
| 2008/0118849 A1 | 5/2008 | Chandhok et al. |
| 2008/0165333 A1 | 7/2008 | Kumazawa et al. |
| 2008/0170310 A1 | 7/2008 | Mann |
| 2009/0213345 A1 | 8/2009 | Mann |
| 2010/0231886 A1 | 9/2010 | Mann |
| 2011/0122392 A1 | 5/2011 | Fiolka et al. |
| 2014/0132941 A1 | 5/2014 | Mann et al. |
| 2014/0320838 A1 | 10/2014 | Mann |

FOREIGN PATENT DOCUMENTS

| | | |
|---|---|---|
| JP | 2008-166814 A | 7/2008 |
| JP | 2008-176326 A | 7/2008 |
| JP | 2008-541418 A | 11/2008 |
| JP | 2010-510666 A | 4/2010 |
| JP | 2011-501448 A | 1/2011 |
| JP | 2011-502275 A | 1/2011 |

OTHER PUBLICATIONS

Chinese office action with English translation for CN application No. 2012 8004 7616.3, dated Aug. 14, 2015.
German Office Action, with translation thereof, for corresponding DE Appl No. 10 2011 083 888.0, dated Nov. 16, 2011.
Taiwanese Office Action and Search Report, with translation thereof, for corresponding TW Appl No. 101135497, dated Jul. 25, 2016.
Japanese office action, with English translation thereof, for corresponding JP Appl No. 2014-532398, dated Aug. 22, 2016.

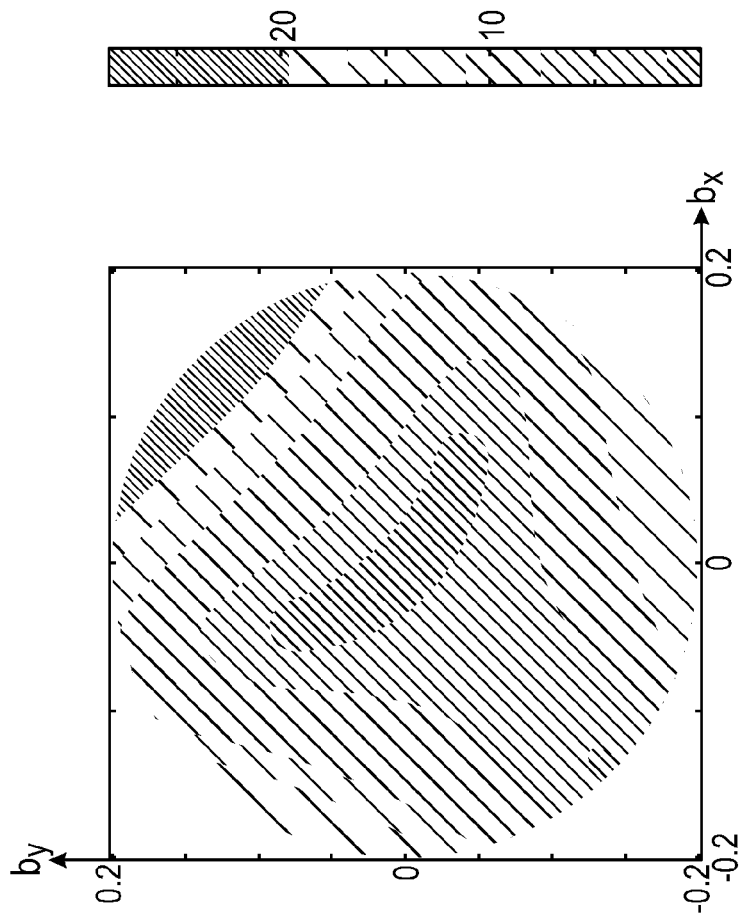
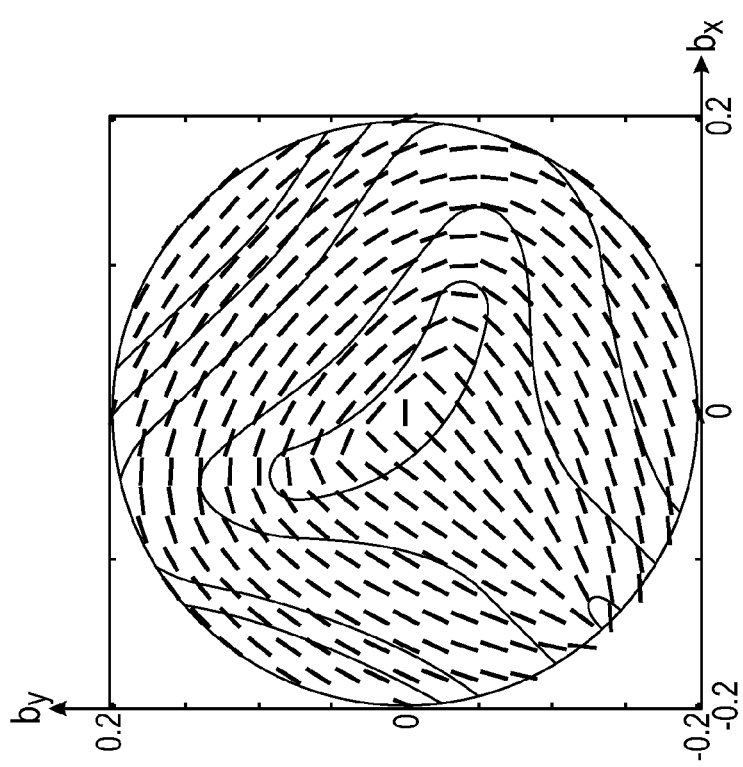
Fig. 6a  Fig. 6b  Fig. 6c

IMAGING CATOPTRIC EUV PROJECTION OPTICAL UNIT

CROSS-REFERENCE TO RELATED APPLICATIONS

The present application is a continuation of, and claims benefit under 35 USC 120 to, international application PCT/EP2012/069158, filed Sep. 28, 2012, which claims benefit under 35 USC 119 of German Application No. 10 2011 083 888.0, filed Sep. 30, 2011. International application PCT/EP2012/054664 also claims priority under 35 USC 119(e) to U.S. Provisional Application No. 61/541,127, filed Sep. 30, 2011. The contents of international application PCT/EP2012/069158 and German patent application 10 2011 083 888.0 are incorporated by reference.

The invention relates to an imaging catoptric EUV projection optical unit and an imaging catoptric optical unit.

Such imaging optical units are known from US 2010/0231886 A1. Such imaging optical units are part of a projection exposure apparatus and are used when the structure of a reticle is imaged in projection lithography for producing integrated circuits.

It is an object of the present invention to develop an imaging optical unit of the type specified at the outset such that bothersome polarization influences are reduced.

According to a first aspect, this object is achieved according to the invention by an imaging catoptric EUV projection optical unit with at least four mirrors which image an object field in an object plane into an image field in an image plane. The imaging optical unit has a first chief ray plane, which is defined by propagation of a chief ray of a central object field point during the reflection at a mirror. The imaging optical unit includes a second chief ray plane, which is defined by propagation of the chief ray of the central object field point during the reflection at one of the other mirrors. The two chief ray planes include an angle that differs from 0.

According to the invention, it was identified that bothersome polarization influences can be reduced by virtue of providing a chief ray propagating via at least two chief ray planes which include an angle that differs from 0. The chief ray of the central object field point thus no longer runs in precisely one plane. This can be used to compensate polarization influences on the mirror reflectivity, which generally differ firstly perpendicular and secondly parallel to the plane of incidence on the respective mirror. Defining the respective chief ray plane by the propagation of the chief ray means that the chief ray of the central object field point incident on the mirror and the chief ray of the central object field point leaving the mirror include an angle that differs from 0 and span the chief ray plane, i.e. both chief rays lie in the chief ray plane. Bothersome polarization influences, which can be reduced by the optical unit according to the invention, can emerge as a result of large illumination angles as a result of large image field-side numerical apertures of the imaging optical unit. Bothersome polarization influences can emerge during the reflection of imaging light at the mirrors of the optical unit.

The imaging optical unit can have an image-side numerical aperture of at least 0.4. An image field of the imaging optical unit can have an area which is at least 1 mm$^2$. An image field of the imaging optical unit can have an area of more than 1 mm$^2$ and can have a lateral dimension that is greater than 10 mm. Here, the image field is that area on which the imaging optical unit enables imaging with aberrations that are smaller than prescribed values.

Chief ray planes that are perpendicular to one another were found to be particularly suitable for reducing bothersome polarization influences.

Precisely two chief ray planes enable a design of the imaging optical unit which is not too complicated.

An intermediate image in the imaging beam path between the object field and the image field makes it possible to influence the angles of incidence in the beam path profile in the imaging optical unit, which can be used as an additional degree of freedom when reducing bothersome polarization influences. The imaging optical unit can have precisely one intermediate image. Other embodiments with more than one intermediate image are also possible.

According to a further aspect, the object specified at the outset is achieved by an imaging catoptric optical unit with at least four mirrors which image an object field in an object plane into an image field in an image plane. The imaging optical unit has an image-side numerical aperture of at least 0.4. The imaging optical unit, considered via the image field, has a maximum diattenuation of 10% for a specific, respectively considered illumination angle.

Here, the diattenuation is defined as $$D=(u-v)/(u+v),$$

where u denotes the overall reflectivity of all mirrors in the imaging optical unit for a maximally reflected polarization direction of the imaging light and v denotes the corresponding overall reflectivity for the polarization of the imaging light perpendicular thereto.

According to the invention, it was identified that the various aspects of the invention make it possible to realize polarization distributions of diffraction orders of the illumination that interact during the imaging, which polarization distributions result in either a small diattenuation or a diattenuation that prefers a tangential polarization of the illumination, i.e. in which a tangential polarization component is reflected at the mirrors of the catoptric optical unit with a greater reflectivity than a radial polarization component perpendicular thereto. Preferring a tangential polarization reduces bothersome polarization influences during imaging.

According to the invention, it was identified that ray guidance over a plurality of chief ray planes, which include an angle that differs from 0, offers an option for reducing bothersome polarization influences. In doing so, it was identified that it is not mandatory for a diattenuation to be minimized independently of a pupil coordinate or independently of the illumination angle. For specific applications it suffices to keep a diattenuation small for respectively a specific absolute illumination angle, i.e. for all pairs of pupil coordinates with the same radius, i.e. with the same distance from a pupil centre, wherein the diattenuation can by all means differ for various absolute illumination angles. By way of example, a small maximum diattenuation over all pupil coordinates can be realized by using an imaging catoptric optical unit with small maximum angles of incidence on the mirrors of the optical unit, for example with maximum angles of incidence that are no more than 20°, are no more than 15° or are even smaller than that. Particularly in the region of the maximum image-side numerical aperture, the design of the imaging optical unit is, according to the invention, designed such that either there is a small maximum diattenuation there, which is less than 10%, or that there is a diattenuation there, which prefers a polarization that is tangential to the centre of the pupil of the imaging optical unit. The imaging optical unit can have precisely one intermediate image. Other embodiments with more than one intermediate image are also possible. The imaging catoptric optical unit can be embodied as an EUV projection optical unit. An image field of the imaging optical unit can have an area of more than 1 mm$^2$ and can have a lateral dimension that is greater than 10 mm. Here, the image field is that area on which the imaging optical unit enables imaging with aberrations that are smaller than prescribed values.

A maximum diattenuation, considered over the image field, of 20% for all pupil coordinates is particularly advantageous.

According to a further aspect, the object specified at the outset is achieved by an imaging optical unit with at least four mirrors which image an object field in an object plane into an image field in an image plane. The imaging optical unit has an image-side numerical aperture of at least 0.4. The imaging optical unit, considered via the image field, has a diattenuation for a specific illumination angle. The diattenuation attenuating imaging light polarized tangentially to the centre of a pupil of the optical unit to a lesser extent than imaging light polarized perpendicularly thereto.

The advantages of the imaging optical unit according to preceding paragraph, which prefers a polarization that is tangential to the pupil centre of the imaging optical unit, which is also referred to as tangential diattenuation, correspond to those that were already discussed above with reference to the imaging optical units according to the first two aspects. The specific illumination angle, for which a tangential diattenuation is present, can be a specific absolute illumination angle or an illumination angle range about this specific absolute illumination angle. An annular illumination setting is an example of such an illumination. The tangential diattenuation can then be present for the whole annular illumination setting. A region about a specific pupil coordinate can also have the tangential diattenuation. There is no need for tangential diattenuation at other illumination angles. By way of example, in the case of a quadrupole illumination setting, individual poles can have a tangential diattenuation while others do not. The tangential diattenuation can be present at the largest illumination angles, i.e. at the edge-side pupil coordinates of the imaging optical unit. In the case of small illumination angles in the region of a centre of the pupil of the imaging optical unit, the diattenuation can deviate from the tangential direction. By way of example, the diattenuation in the region of the pupil coordinates that cover half the numerical aperture from the centre can be at most 20% or at most 10%. A tangential diattenuation can then be present outside this pupil boundary, i.e. towards larger illumination angles. It is not mandatory for the pupil boundary to lie at half the image-side numerical aperture; rather, it can also lie at a different point in the region between 30% and 70% of the numerical aperture.

The features of the imaging optical units according to the invention, explained above, can also be implemented in combination. The specified small diattenuation values or the diattenuation for preferring a tangential polarization can thus be achieved by ray guidance through at least two chief ray planes which include an angle that differs from 0.

The advantages of an illumination system with an illumination optical unit for illuminating the object field with illumination or imaging light and an imaging optical unit described above, a projection exposure apparatus with such an illumination system and a light source for generating the illumination or imaging light, a production method of using such a projection exposure apparatus, and a micro- or nano-structured component produced by such a method, correspond to those that were already explained above with reference to the imaging optical unit.

Exemplary embodiments of the invention will be explained in more detail below on the basis of the drawing. In detail:

FIG. 1 schematically shows a projection exposure apparatus for EUV microlithography;

FIGS. 6a-6c shows, in an illustration similar to FIG. 4, a dependence of a diattenuation on imaging light, which illuminates a central image field point, depending on the illumination angle at the imaging optical unit according to FIG. 5;

Figure 1:
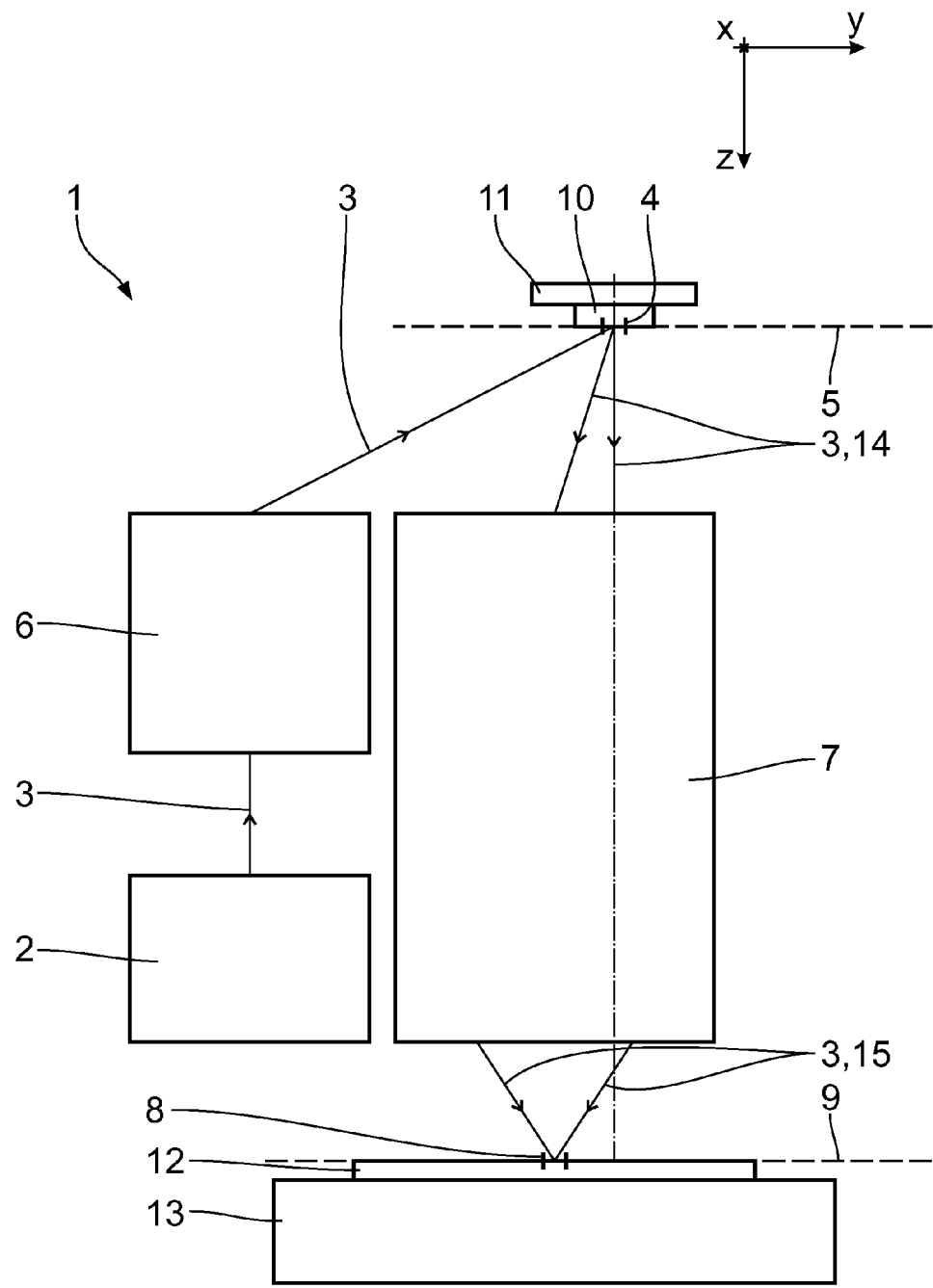

A projection exposure apparatus 1 for EUV projection lithography has a light source 2 for illumination or imaging light 3. The light source 2 is an EUV light source, which produces light in a wavelength range of, for example, between 5 nm and 30 nm, more particularly between 5 nm and 10 nm, or around 13.5 nm. A beam path of the illumination light 3 is illustrated very schematically in FIG. 1. An illumination optical unit 6 serves to guide the illumination light 3 from the light source 2 to an object field 4 in an object plane 5. A projection optical unit or an imaging optical unit 7 is used to image the object field 4 into an image field 8 in an image plane 9 with a predetermined reduction scale. One of the exemplary embodiments illustrated in FIG. 2 ff. can be used for the projection optical unit 7. The projection optical unit 7 according to FIG. 1 has a reduction factor of 4. Other reduction scales are also possible, e.g. 4×, 5× or else reduction scales that are greater than 8×. In the projection optical unit 7, the image plane 9 is arranged parallel to the object plane 5. A section of a reflection mask 10, which is also referred to as reticle, that coincides with the object field 4 is imaged. The reflection mask 10 is held by a reticle holder 11.

Imaging by the projection optical unit 7 is brought about on the surface of a substrate 12 in the form of a wafer, which is carried by a substrate holder 13. FIG. 1 schematically illustrates, between the reticle 10 and the projection optical unit 7, a ray beam 14 of the illumination light 3 that enters into the projection optical unit and, between the projection optical unit 7 and the substrate 12, a ray beam 15 of the illumination light 3 that emerges from the projection optical unit 7. An image field-side numerical aperture of the projection optical unit 7 is 0.4. In FIG. 1, this is reproduced not to scale.

In order to facilitate the description of the projection exposure apparatus 1 and the various embodiments of the projection optical unit 7, a Cartesian xyz-coordinate system is specified in the drawings, from which the respective positional relationship of the components illustrated in the figures emerges. In FIG. 1, the x-direction runs perpendicular to the plane of the drawing and into the latter. The y-direction runs to the right and the z-direction runs downwards.

The projection exposure apparatus 1 is the scanner type. Both the reticle 10 and the wafer 12 are scanned in the y-direction during the operation of the projection exposure apparatus 1. A stepper-type projection exposure apparatus 1, in which there is a stepwise displacement of the reticle 10 and the wafer 12 in the y-direction between individual exposures of the wafer 12, is also possible.

Figure 2:
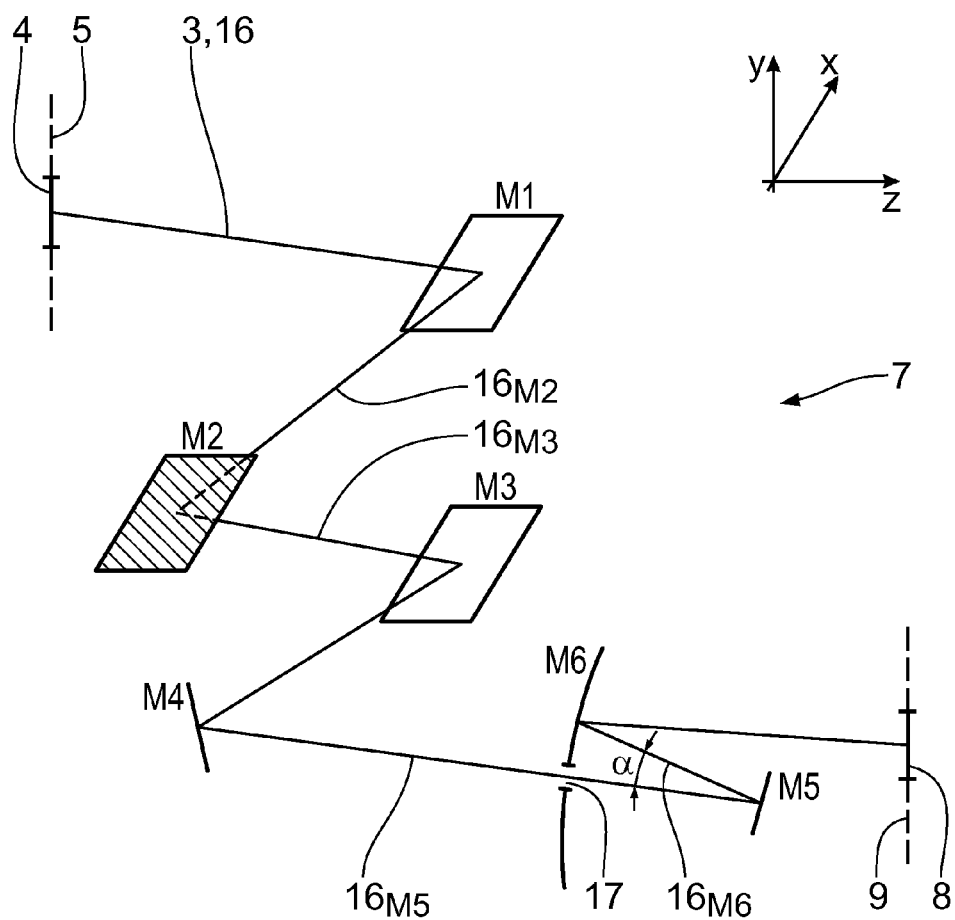
FIG. 2 shows, in a schematic and partly perspective fashion, a catoptric imaging optical unit of the projection exposure apparatus with six mirrors, wherein a beam path of a chief ray of a central object field point is shown schematically.

FIG. 2 schematically shows an embodiment of the projection optical unit 7. The beam path of a chief ray 16, of a central object field point, between the object field 4 and the image field 8 is illustrated in FIG. 2. The projection optical unit 7 according to FIG. 2 has a total of six mirrors, which, in the sequence of the beam path of the chief ray 16 starting from the object field 4, are numbered M1 to M6 in order.

In FIG. 2, all that is illustrated are schematic sections of the reflection surfaces of the mirrors M1 to M6, with the illustration of holding structures or support substrates also being dispensed with. In the perspective view of FIG. 2, the rear side, facing away from the reflection surface, of the mirror M2 can be seen. The illustration according to FIG. 2 is a meridional section for the mirrors M4 to M6.

The chief ray 16 runs parallel to the yz-plane between the object field 4 and the mirror M1. The mirror M1 deflects the chief ray 16 into a chief ray plane parallel to the xy-plane. The chief ray 16 runs parallel to the xy-plane between the mirrors M1 and M4. The mirror M4 deflects the chief ray 16 from the chief ray plane parallel to the xy-plane to the chief ray plane parallel to the yz-plane. The chief ray 16 runs parallel to the yz-plane between the mirror M4 and the image field 8, with the yz-profile plane of the chief ray 16 between mirror M4 and the image field 8 coinciding with the yz-profile plane between the object field 4 and the mirror M1.

The mirror M6 is obscured, i.e. it has a passage opening 17 for the imaging light 3 in the beam path between the mirrors M4 and M5.

A first chief ray plane of the imaging optical unit 7 according to FIG. 2 is prescribed by the profile of the chief ray 16 during the reflection at the mirror M5. The chief ray section $16_{M5}$ incident on the mirror M5 and the chief ray section $16_{M6}$ leaving the mirror M5 include an angle α that differs from 0 and therefore span the first yz-chief ray plane.

A second chief ray plane is prescribed by the profile of the chief ray 16 during the reflection at the mirror M2. The two chief ray sections $16_{M2}$ and $16_{M3}$ reflected there likewise include an angle that differs from 0 and span the second yz-chief ray plane parallel to the xy-plane.

The two chief ray planes, which are prescribed by the mirrors M5 and M2 and are parallel to the yz-plane and parallel to the xy-plane, include an angle that differs from 0, specifically they are perpendicular to one another.

The imaging optical unit 7 according to FIG. 2 has precisely two chief ray planes.

As a result of the imaging light 3 running through two chief ray planes which include an angle that differs from 0, an equalization of a diattenuation of the imaging light 3 is achieved when passing through the imaging optical unit 7.

The imaging light 3 has polarization components firstly in the xy-plane and secondly in the yz-plane. The value $$D=(u-v)/(u+v)$$

is referred to as diattenuation of the imaging optical unit 7, where u denotes the overall reflectivity of all mirrors M1 to M6 in the imaging optical unit for the maximally reflected polarization direction and v denotes the corresponding overall reflectivity for the polarization perpendicular thereto.

For a respectively considered absolute illumination angle, with which any image field point of the image field 8 of the imaging optical unit 7 is illuminated, the imaging optical unit 7 according to FIG. 2 has a maximum diattenuation of 10%.

The illumination angle is measured starting from a normal, penetrating the central image field point, on the image plane 9.

The imaging optical unit 7 according to FIG. 2 can be configured such that, considered over the whole image field 8, it has a maximum diattenuation of 20% for all illumination angles.

Figure 3:
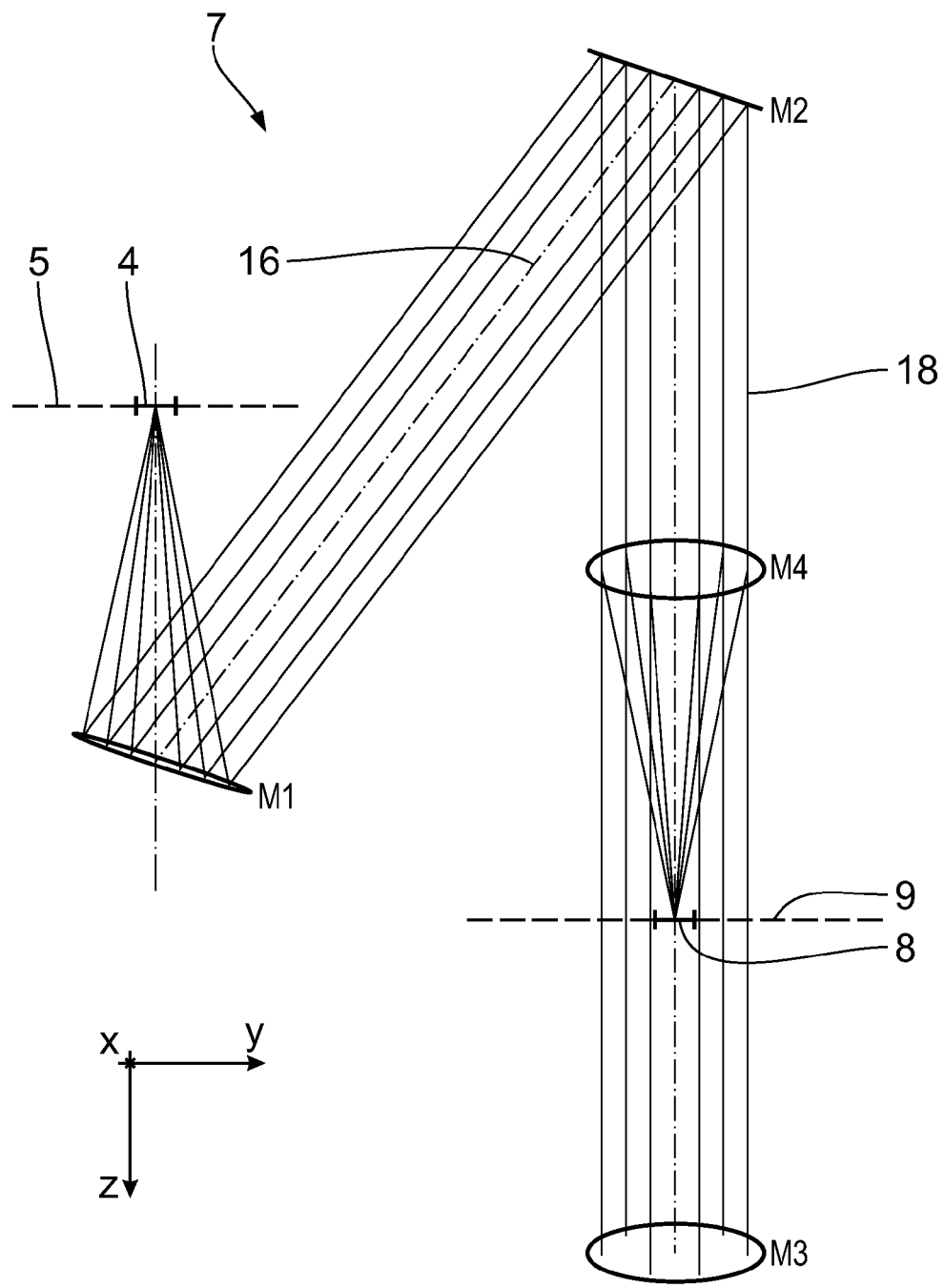
FIG. 3 shows a further embodiment of the catoptric imaging optical unit with four mirrors.

FIG. 3 shows a further embodiment of the imaging optical unit 7. This embodiment has not been optimized for projection purposes and serves for explaining the principle. In addition to the profile of the chief ray 16 of the central object field point, the profile of a few further imaging rays 18 have also been illustrated, the latter belonging to various pupil coordinates or illumination angles of the central image field point.

The imaging optical unit 7 according to FIG. 3 has a total of four mirrors which, in the sequence of the beam path of the individual rays 16, 18 starting from the object field 4, are numbered M1 to M4 in order. Once again, it is sections of the reflection surfaces without holding structures and substrates that are illustrated. The mirrors M1 to M4 carry a bi-layer coating in the form of a molybdenum/silicon bi-layer. The imaging optical unit 7 according to FIG. 3 is designed for a used wavelength of 13.5 nm. An imaging scale of the imaging optical unit 7 according to FIG. 3 is 1×. An image field-side aperture is 0.2.

Between the object field 4 and the mirror M3, the chief ray 16 runs in a first chief ray plane, which runs parallel to the yz-plane. This first yz-chief ray plane is prescribed by the profile of the chief ray 16 during the reflection at, for example, the mirrors M1 and M2, as already explained above in the context of the embodiment according to FIG. 2.

The mirror M3 deflects the chief ray 16 out of the first chief ray plane yz, with the chief ray 16, following the reflection at the mirror M3, running in the xz-plane up to the image field 8. The mirror M4 is arranged outside the yz-plane and can be situated in front of or behind the plane of the drawing of FIG. 3.

The chief ray 16 runs parallel to the z-axis between the mirror M4 and the image field 8.

The second chief ray plane of the imaging optical unit 7 according to FIG. 3, i.e. the plane parallel to the xz-axis, is prescribed by the profile of the chief ray 16 during the reflection at, for example, the mirrors M3 and M4.

Figure 4:
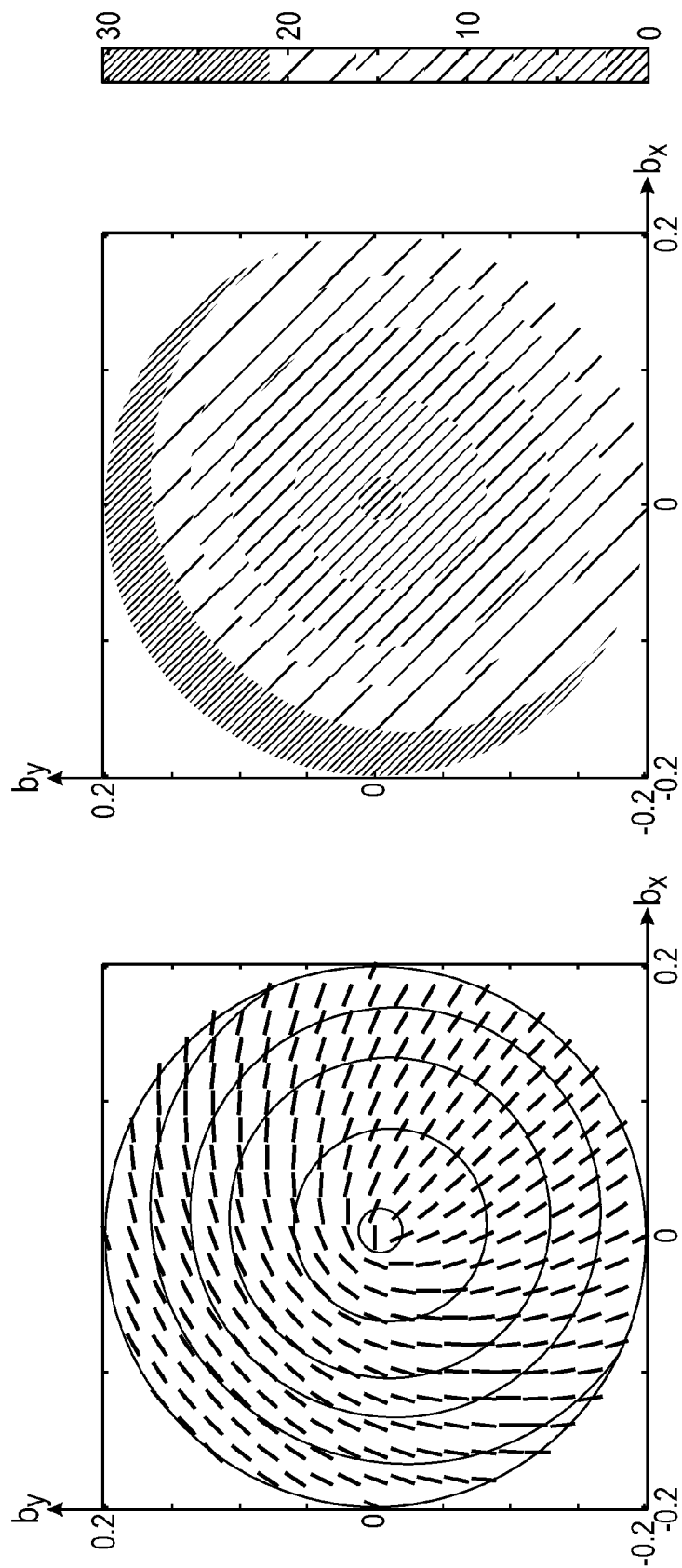
FIGS. 4a-4b show diagrams and a shading scale in respect of the dependence of a diattenuation on imaging light, which illuminates a central image field point, depending on the illumination angle at the imaging optical unit according to FIG. 3.
FIG. 4c shows a shading scale.

FIG. 4 shows the dependence of the diattenuation D on the illumination angle of the central image field point.

In FIG. 4b, the diattenuation D ($b_x$, $b_y$) is plotted at the respective pupil coordinates $b_x$, $b_y$, for example for an entrance pupil of the optical unit 7 according to FIG. 3. Pupil coordinates with the same radius, i.e. the same distance from the origin of the coordinate system according to FIGS. 4a and 4b, which coincides with a centre of the entrance pupil of the optical unit 7, belong to the same illumination angle. The value $b_x^2 b_y^2$ thus constitutes a measure for an absolute illumination angle, measured starting from a normal on the image plane through the central image field point, wherein the angles of the respectively considered illumination angle with respect to this normal, firstly measured in the xz-plane and secondly measured in the yz-plane, are the values $b_x$, $b_y$ of the pupil coordinates in units of the image field-side numerical aperture of the imaging optical unit 7 according to FIG. 3. The diattenuation D is plotted in percentages in FIGS. 4a and 4b.

The respective value D dependent on the pupil coordinates $b_x$, $b_y$ is indicated by a shading scale, which is specified in FIG. 4c. In the centre of FIGS. 4a and 4b, i.e. at the smallest pupil coordinates, in the region of a perpendicular illumination, the diattenuation is small. Towards the outside, i.e. to larger absolute illumination angles, the diattenuation D ($b_x$, $b_y$) increases, with the value profile of the diattenuation being approximately rotationally symmetric. In the case of a given absolute numerical aperture, i.e. in the case of a respectively considered absolute illumination angle, a variation of the diattenuation D about a mean diattenuation value at this absolute illumination angle is therefore small and is, apart from illumination angles in the region of the maximum image field-side numerical aperture, less than 20% and less than 10% for even smaller illumination angles. In the illustration according to FIG. 4b, the diattenuation at a respectively considered illumination angle varies by less than 10% from a mean diattenuation value at this illumination angle.

In addition to the diattenuation D plotted in terms of absolute value, FIG. 4a at the respective pupil coordinates $b_x$, $b_y$ also indicates the profile of that polarization direction which is preferably reflected by the mirrors M1 to M4 of the imaging optical unit 7. In the region of the second quadrant in FIG. 4a, i.e. at negative $b_x$- and positive $b_y$-values, there is, to a good approximation, a preference for the tangential polarization about the pupil centre. This approximation of preference for the tangential polarization, with restrictions, also still applies to the first and the third pupil coordinate quadrants in FIG. 4a. The preference for the tangential polarization is advantageous for imaging even if the absolute value for the diattenuation is greater than 20% for example. Boundary lines between the transitions of the diattenuation values as per the shading scale in FIG. 4c are once again clarified by solid lines in FIG. 4a.

Figure 5:
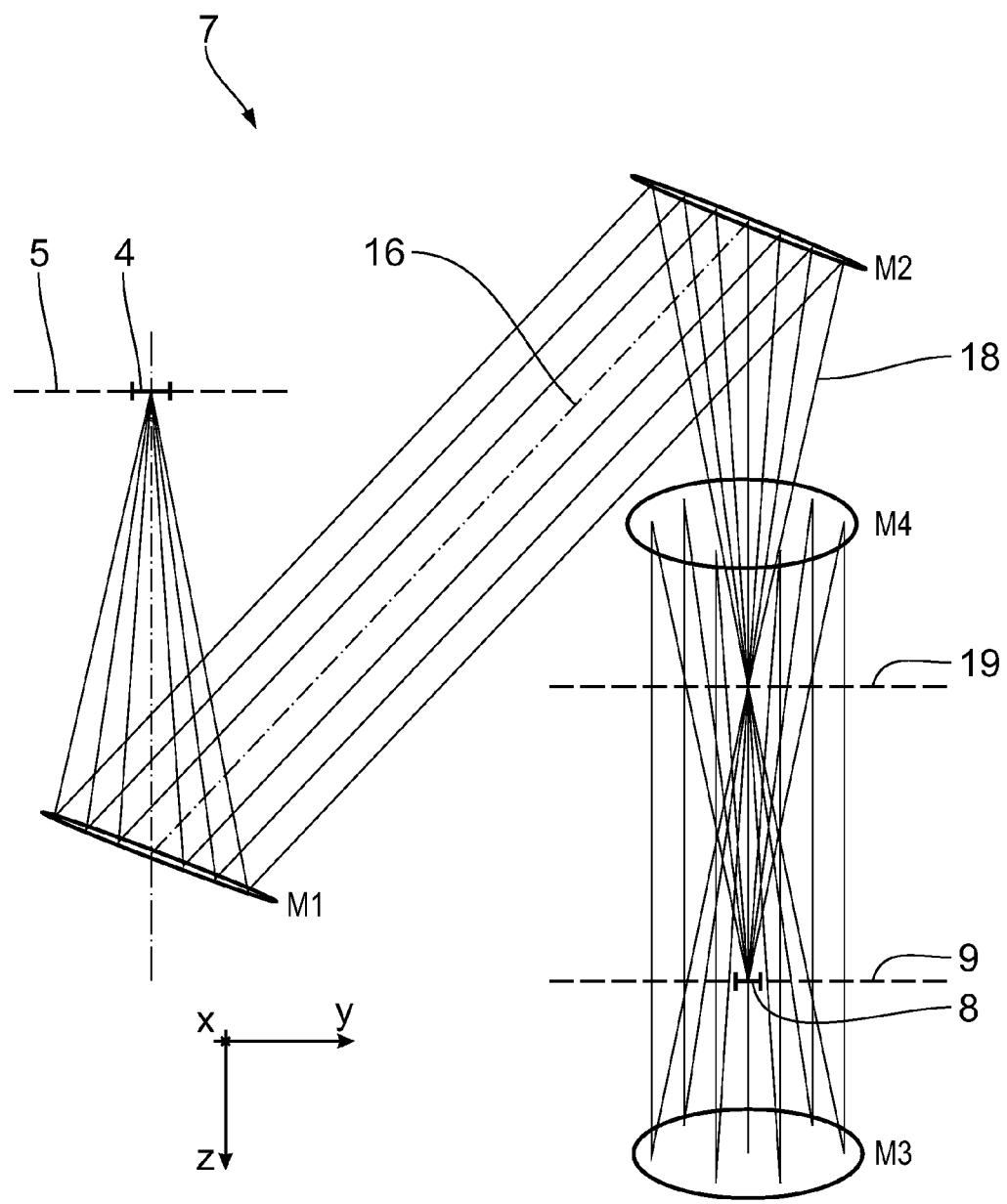
FIG. 5 shows a further embodiment of the catoptric imaging optical unit with four mirrors.
Figure 7:
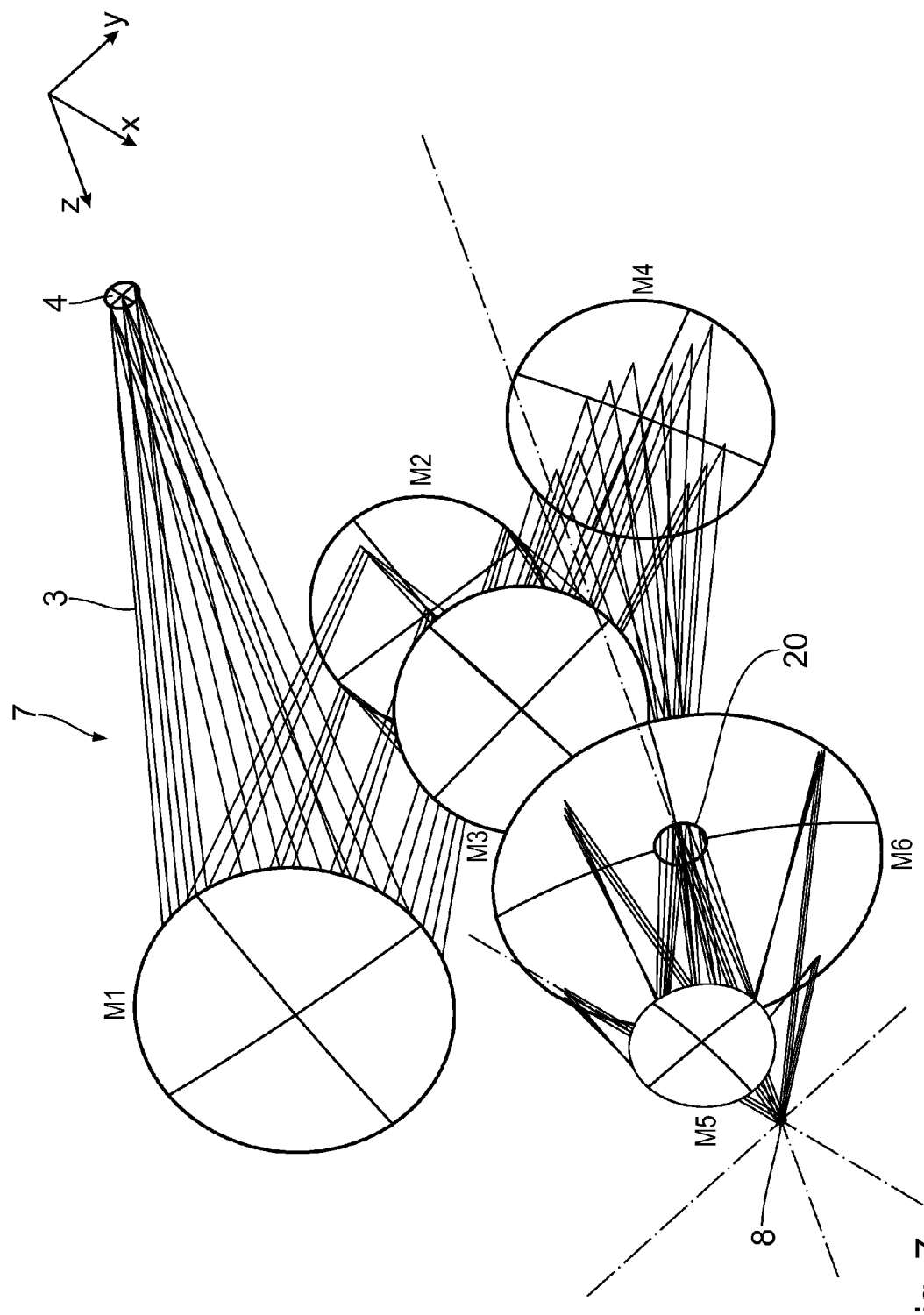
FIGS. 7 to 9 show, in a perspective view, a mirror arrangement of a further embodiment of a catoptric imaging optical unit of the projection exposure apparatus with six mirrors, wherein a beam path of a plurality of individual rays from, in turn, a plurality of field points is shown.
Figure 8:
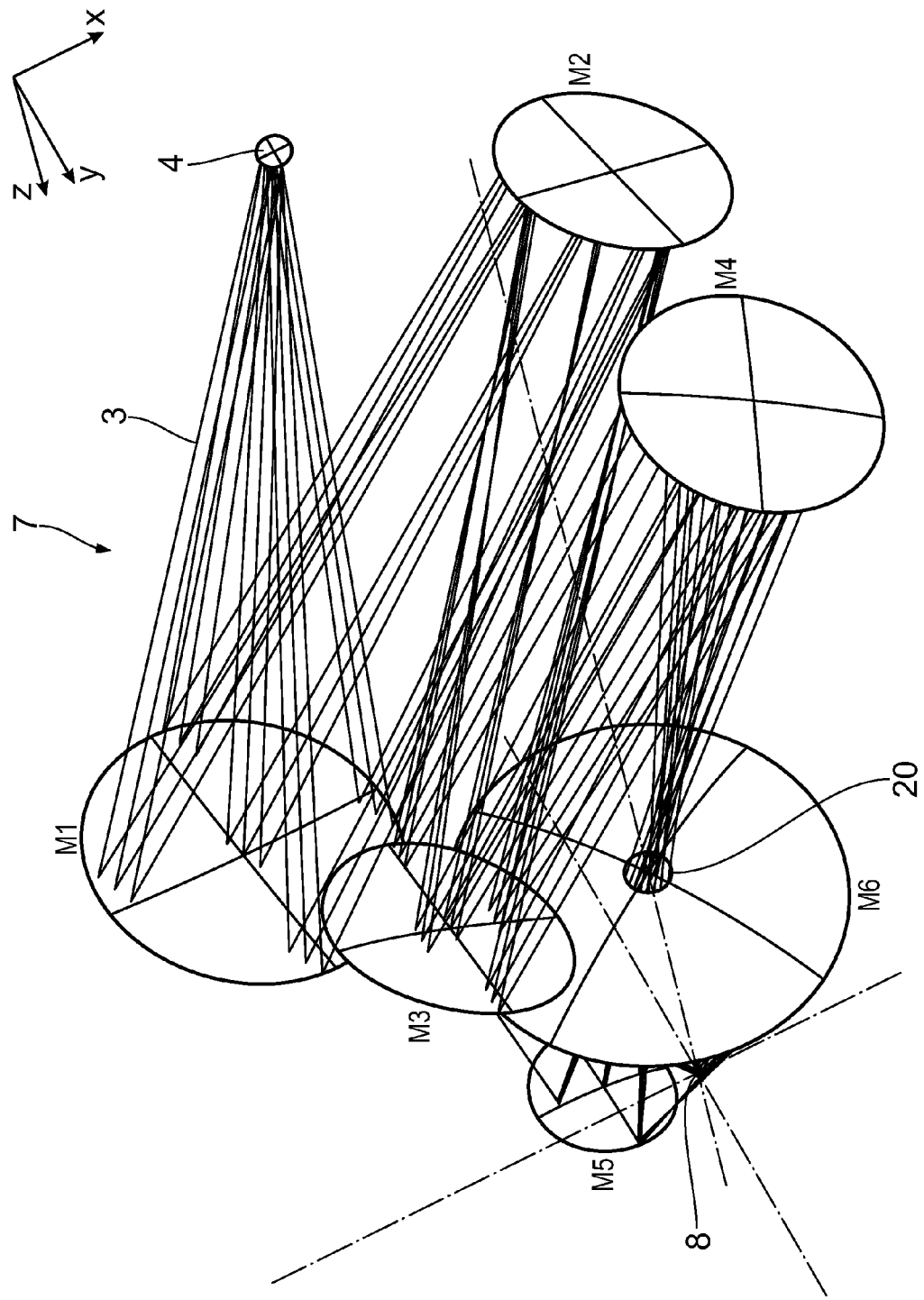
Figure 9:
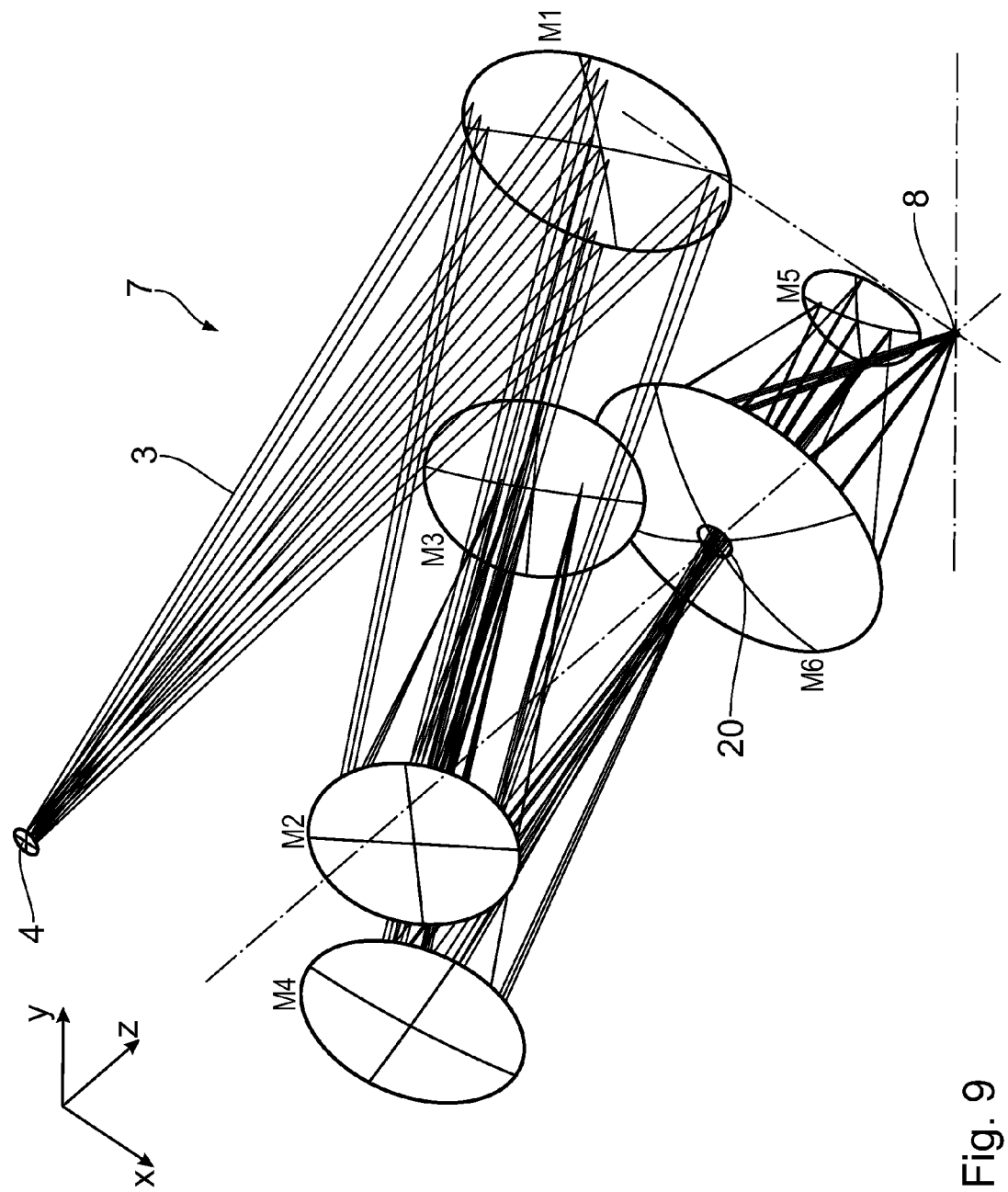

FIGS. 5 and 6 are used below to explain a further embodiment of the imaging optical unit 7. Components and functions that correspond to those that were already explained above with reference to FIGS. 1 to 4, and in particular with reference to FIGS. 3 and 4, have the same reference signs and will not be discussed again in detail.

In contrast to the imaging optical unit 7 according to FIG. 3, the imaging optical unit 7 according to FIG. 5 has an intermediate image 19 in the beam path between the mirrors M2 and M3. As a result of this, there is a change in the angle of incidence distribution of the imaging rays 18, particularly on the subsequent mirrors M3 and M4. This leads to a correspondingly modified influence, particularly of mirrors M3 and M4, on the reflectivities of the polarization components of the imaging light 3, firstly parallel to the xz-plane and secondly parallel to the yz-plane.

FIGS. 6a-6c in turn show the resultant diattenuation for the whole imaging optical unit 7 according to FIG. 5. Apart from the largest illumination angles, there is an overall very small diattenuation, which is practically vanishing for a majority of the illumination angles. A diattenuation greater than 15% is present only in the region of the first quadrant of the pupil coordinates according to FIG. 6b, i.e. in the region of positive $b_x$- and positive $b_y$-values. A diattenuation of no more than 20% is present at practically all pupil coordinates.

Here, the described embodiments of the imaging optical unit 7 are catoptric optical units in each case, i.e. pure mirror optical units without refractive components.

FIGS. 7 to 12 are used to explain a further embodiment of the imaging optical unit 7 below. Components and functions that correspond to those that were already explained above with reference to FIGS. 1 to 6 and in particular with reference to FIGS. 3 and 4 bear the same reference signs and will not be discussed again in detail. The Cartesian xyz-coordinate system used below to describe positional relationships of the components of the imaging optical unit 7 according to FIG. 7 ff. is rotated about the z-axis by 90° compared to the xyz-coordinate system used above with reference to FIGS. 1 to 6, and so scanning of the reticle 10 and of the wafer 12 now takes place in the x-direction.

The imaging optical unit 7 according to FIGS. 7 to 12 has a total of six mirrors, which are numbered M1 to M6 in order in the sequence in which they are struck by the illumination light 3 in the imaging beam path between the object field 4 and the image field 8. Shown here is the imaging beam path of a plurality of individual rays of the illumination light 3, which in turn start from a plurality of object field points. The image field 8 has field dimensions of 2 mm in the x-direction and of 26 mm in the y-direction. The object field 4 accordingly has dimensions enlarged by a factor 4 in both the x- and in the y-direction. The imaging optical unit 7 according to FIG. 7 ff. thus provides a reduction by a factor 4 between the object field 4 and the image field 8. Attached to the mirror M2 is an aperture stop for restricting the beam of the illumination or imaging light 3. This aperture stop can be embodied as a coating on the mirror M2.

The mirrors M1 to M4 lie in a common plane, which runs perpendicular to the xz-plane and is tilted to the yz-plane. The mirrors M3 to M6 and the image field 8 are arranged in a second plane, which runs parallel to the xz-plane. The object field 4 and the mirrors M1 and M2 also lie in a plane which is parallel to the xz-plane and spaced apart from the plane in which the mirrors M3 to M6 lie. The chief ray plane yz and the chief ray plane xz are part of a Cartesian xyz-coordinate system and include an angle of 90°, i.e. they are perpendicular to one another. There is an intermediate image 19 in the imaging beam path between the mirrors M4 and M5. Spatially, the intermediate image is situated in the region of a passage opening 20 in the last mirror M6, through which passage opening the illumination light 3, which is routed between the mirrors M4 and M5, passes through the mirror M6.

The imaging optical unit 7 according to FIGS. 7 to 12 has an image-side numerical aperture of 0.45. A reduction scale of the imaging optical unit 7 according to FIGS. 7 to 12 is 4×. A chief ray angle CRA (compare FIG. 12) of the imaging light 3 to the normal to the object plane 5 is 9.5° for a central field point of the object field 4.

The optical design of the imaging optical unit 7 according to FIGS. 7 to 12 is described below on the basis of design data from the optical design program CODE V®.

The freeform reflection surfaces of the mirrors M1 to M6 are described by the following equation:

$$Z = \frac{cr^2}{1 + \sqrt{1 - (1+k)c^2 r^2}} + \sum_{i,j} c_{ij} x^i y^j$$

Z is the arrow height of the freeform surface at the point x, y ($x^2+y^2=r^2$).

c is a constant corresponding to the vertex curvature of a corresponding aspheric lens. k corresponds to a conical constant of a corresponding aspheric lens. $c_{ij}$ are the coefficients of the monomials $x^i y^j$. The values of c, k and $c_{ij}$ are typically determined on the basis of the desired optical properties of the mirror within the imaging optical unit 7.

Freeform surfaces can also be described mathematically by Zernike polynomials, which, for example, are explained in the manual of the optical design program CODE V®. Alternatively, freeform surfaces can also be described with the aid of two-dimensional spline surfaces. Examples of this are Bezier curves or non-uniform rational basis splines (NURBS). By way of example, two-dimensional spline surfaces can be described by a grid of points in an xy-plane and associated z-values, or by these points and gradients associated therewith. Depending on the respective type of the spline surface, the complete surface is obtained by interpolation between the grid points using e.g. polynomials or functions that have specific properties in respect of their continuity and differentiability. Examples of this are analytic functions.

The mirrors M1 to M6 carry multiple reflection layers for optimizing their reflection for the incident EUV illumination light 3. The optimization of the reflection can be improved the closer the impact angles of the individual rays of the illumination or imaging light 3 on the mirror surfaces are to perpendicular incidence.

The first of the following tables (Table 1) of the optical design respectively specifies the reciprocal of a vertex curvature (radius) for the optical surfaces, i.e. for the reflection surfaces of the mirrors M1 to M6.

The second of the following tables (Table 2) specifies decentring and inclination or tilt values of the mirrors M1 to M6 in the form of translation parameters XDE, YDE, ZDE and rotation parameters ADE, BDE, CDE.

The meaning of these parameters corresponds to those which are known from the optical design program CODE V®. This meaning will once again be explained briefly below. It should be noted that in respect of decentring, an additional rotation of 180° about the y-axis is still undertaken in contrast to the descriptions known from CODE V®. This leads to positive distance values between the mirrors or between the reference surfaces. When defining the ray intersection side using CODE V®, the ray intersection side (SID) is to be set to "NEG". Such ray intersection side (SID) parameter is described e.g. on page 4-60 ff in the CODE V® 10.4 reference manual, Volume I, September 2011.

ADE Rotation of the surface by angle alpha in degrees about the x-axis.

BDE Rotation of the surface by angle beta in degrees about the y'-axis which then emerges from rotating the y-axis.

CDE Rotation of the surface by angle gamma in degrees about the z"-axis which has emerged from the z-axis by firstly rotation about the x-axis and secondly about the y'-axis.

XDE Translation of the surface in the x-axis in mm.
YDE Translation of the surface in the y-axis in mm.
ZDE Translation of the surface in the z-axis in mm.

The third following table (Tables 3a and 3b) specifies the coefficients $c_{ij}$ of the monomials $x^i y^j$ in the aforementioned freeform surface equation for mirrors M1 to M6.

TABLE 1

| Surface | Radius |
| --- | --- |
| Object plane | infinity |
| M1 | −2648.044184 |
| M2 | 22960.104483 |
| M3 | 2860.372482 |
| M4 | −1815.779736 |
| M5 | 504.945215 |
| M6 | −706.456328 |
| Image plane | infinity |

TABLE 2

Decentring and tilt angle

| Surface | XDE | YDE | ZDE | ADE | BDE | CDE |
| --- | --- | --- | --- | --- | --- | --- |
| Object plane | 0.000000 | 0.000000 | 0.000000 | 0.000000 | 0.000000 | 0.000000 |
| M1 | 305.573789 | −34.039631 | 1817.972774 | 4.193642 | −5.815188 | −8.157803 |
| M2 | −472.877892 | −33.820402 | 448.867511 | −10.210273 | −191.664381 | 12.284104 |
| M3 | 145.260385 | −481.631793 | 1464.173836 | −12.162098 | −30.754773 | −4.726896 |
| M4 | −481.815240 | −481.508915 | 431.654420 | −0.002389 | −203.368069 | −22.476721 |
| M5 | −18.782074 | −481.355118 | 2103.784831 | 0.007160 | −15.226020 | −3.316004 |
| M6 | −159.869266 | −481.417847 | 1578.096249 | −0.207089 | −187.104105 | −55.421103 |
| Image plane | 0.000000 | 0.000000 | 2192.524695 | 0.000000 | 0.000000 | 0.000000 |

TABLE 3a

| Coefficient | M1 | M2 | M3 |
| --- | --- | --- | --- |
| X | −2.552485E−01 | −3.283324E−01 | 3.131364E−04 |
| Y | 4.513489E−02 | 4.336789E−02 | −1.886828E−03 |
| X2 | −2.496545E−05 | −5.748374E−06 | 9.804823E−05 |
| XY | −4.709745E−06 | 2.929715E−05 | 9.785084E−05 |
| Y2 | 1.275106E−05 | −1.623710E−06 | −1.753080E−04 |
| X3 | −7.490557E−09 | 2.141492E−07 | 5.344556E−07 |
| X2Y | 1.360743E−08 | −3.228143E−07 | 3.290905E−07 |
| XY2 | 7.759237E−08 | 7.055326E−08 | 1.255602E−07 |
| Y3 | 5.385756E−09 | −1.030819E−08 | 2.273968E−08 |
| X4 | −7.423991E−12 | 2.740267E−10 | 1.161193E−09 |
| X3Y | −7.789197E−12 | −5.149048E−10 | 8.071598E−10 |
| X2Y2 | −1.803679E−12 | 5.208166E−10 | 3.386959E−10 |
| XY3 | 3.123165E−12 | −3.672083E−12 | 1.698773E−10 |
| Y4 | 1.585952E−12 | 6.322235E−11 | 4.792957E−12 |
| X5 | −1.122002E−14 | 1.360011E−13 | 1.346860E−12 |
| X4Y | −2.561007E−15 | −9.472242E−13 | 1.692105E−12 |
| X3Y2 | −7.341755E−15 | 7.270213E−13 | 1.144118E−12 |
| X2Y3 | 2.608413E−15 | −5.418624E−13 | 4.650047E−13 |
| XY4 | −4.546959E−15 | 8.326234E−14 | −7.633684E−14 |
| Y5 | 2.209581E−15 | 4.898049E−14 | −2.660709E−17 |
| X6 | −2.088419E−17 | −7.574627E−17 | 5.063545E−15 |
| X5Y | 4.067591E−17 | −2.752801E−16 | −6.847713E−15 |

TABLE 3a-continued

| Coefficient | M1 | M2 | M3 |
|---|---|---|---|
| X4Y2 | −3.209935E−17 | 2.128181E−15 | −3.484772E−15 |
| X3Y3 | 1.326889E−17 | 2.496004E−18 | −1.727155E−15 |
| X2Y4 | 2.005796E−17 | 1.642674E−15 | −7.402284E−16 |
| XY5 | −2.153712E−17 | 8.619971E−16 | −7.023807E−17 |
| Y6 | 7.031581E−18 | 3.018558E−16 | −5.904251E−17 |
| X7 | −7.095014E−20 | −2.184083E−18 | 3.534016E−17 |
| X6Y | −1.877551E−20 | 8.069367E−18 | −6.458748E−17 |
| X5Y2 | −1.782909E−21 | −7.171148E−18 | −8.961763E−17 |
| X4Y3 | −7.272771E−20 | 7.334482E−18 | −3.758514E−17 |
| X3Y4 | −3.683629E−20 | −3.229648E−18 | −7.602384E−18 |
| X2Y5 | −4.080520E−20 | 1.732968E−18 | −5.070519E−19 |
| XY6 | 3.555920E−21 | −6.530600E−19 | 1.541444E−19 |
| Y7 | −1.581699E−22 | 4.344477E−19 | −1.439807E−20 |
| X8 | 5.154333E−23 | −8.262628E−21 | 3.810649E−19 |
| X7Y | −2.121857E−22 | 3.205304E−20 | 8.619901E−19 |
| X6Y2 | 2.711810E−22 | −7.302157E−20 | 9.377840E−20 |
| X5Y3 | −2.631038E−22 | 2.993325E−20 | −9.406916E−20 |
| X4Y4 | 2.505609E−24 | −5.959552E−20 | −1.319137E−20 |
| X3Y5 | −1.414276E−22 | 2.265139E−21 | 3.000266E−20 |
| X2Y6 | −9.459223E−23 | −2.578485E−20 | 7.130840E−21 |
| XY7 | 9.302010E−23 | −2.338337E−22 | 9.073679E−22 |
| Y8 | 5.917445E−24 | −4.292258E−21 | 4.918382E−22 |
| X9 | −1.176898E−25 | −2.538973E−23 | 7.258883E−22 |
| X8Y | 2.560439E−26 | 1.329617E−23 | 2.680452E−21 |
| X7Y2 | −8.949191E−25 | −1.551430E−22 | 7.383072E−23 |
| X6Y3 | 5.934517E−25 | 7.621236E−24 | −8.377442E−22 |
| X5Y4 | −4.991909E−25 | −4.131256E−23 | −3.204037E−22 |
| X4Y5 | 1.197862E−24 | 2.256452E−23 | −1.728816E−22 |
| X3Y6 | −5.532085E−25 | −4.334289E−24 | 1.235500E−23 |
| X2Y7 | 3.720874E−25 | 1.094273E−23 | −1.235466E−23 |
| XY8 | −1.022775E−25 | 1.163846E−23 | 1.928222E−25 |
| Y9 | −2.879262E−26 | −6.379814E−26 | 7.015097E−25 |
| X10 | −2.720299E−28 | 3.924841E−26 | −1.481697E−23 |
| X9Y | −6.388986E−28 | −3.155426E−25 | −1.717157E−24 |
| X8Y2 | −1.336772E−27 | 4.490411E−25 | 8.863983E−24 |
| X7Y3 | 5.266971E−28 | 1.365593E−25 | 7.397201E−24 |
| X6Y4 | −1.106860E−27 | 1.097812E−24 | 3.260299E−24 |
| X5Y5 | 1.343277E−27 | 3.451172E−25 | 3.640949E−24 |
| X4Y6 | 4.127581E−28 | 6.954782E−25 | 7.862214E−25 |
| X3Y7 | 4.593674E−28 | 1.935475E−25 | 1.042095E−25 |
| X2Y8 | −5.285495E−28 | 3.436546E−25 | 3.413288E−26 |
| XY9 | −4.488550E−29 | 1.481782E−26 | 1.378870E−26 |
| Y10 | −3.612161E−28 | 5.046107E−26 | 1.875209E−27 |

TABLE 3b

| Coefficient | M4 | M5 | M6 |
|---|---|---|---|
| X | 3.1313295e−04 | −3.2833235e−01 | −2.5524851e−01 |
| Y | −1.8868263e−03 | 4.3367887e−02 | 4.5134887e−02 |
| X2 | 9.8048309e−05 | −5.7483741e−06 | −2.4965449e−05 |
| XY | 9.7850455e−05 | 2.9297145e−05 | −4.7097450e−06 |
| Y2 | −1.7530816e−04 | −1.6237101e−06 | 1.2751059e−05 |
| X3 | 5.3446084e−07 | 2.1414921e−07 | −7.4905569e−09 |
| X2Y | 3.2908732e−07 | −3.2281434e−07 | 1.3607432e−08 |
| XY2 | 1.2555383e−07 | 7.0553263e−08 | 7.7592372e−09 |
| Y3 | 2.2737643e−08 | −1.0308189e−08 | 5.3857560e−09 |
| X4 | 1.1613874e−09 | 2.7402672e−10 | −7.4239910e−12 |
| X3Y | 8.0700934e−10 | −5.1490483e−10 | −7.7891966e−12 |
| X2Y2 | 3.3865521e−10 | 5.2081656e−10 | −1.8036792e−12 |
| XY3 | 1.6982361e−10 | −3.6720828e−12 | 3.1231649e−12 |
| Y4 | 4.7837012e−12 | 6.3222351e−11 | 1.5859521e−12 |
| X5 | 1.3471858e−12 | 1.3600111e−13 | −1.1220017e−14 |
| X4Y | 1.6922399e−12 | −9.4722422e−13 | −2.5610074e−15 |
| X3Y2 | 1.1437278e−12 | 7.2702125e−13 | −7.3417550e−15 |
| X2Y3 | 4.6446691e−13 | −5.4186243e−13 | 2.6084134e−15 |
| XY4 | −7.6421462e−14 | 8.3262341e−14 | −4.5469587e−15 |
| Y5 | −6.3318807e−17 | 4.8980492e−14 | 2.2095811e−15 |
| X6 | 5.0691128e−15 | −7.5746266e−17 | −2.0884187e−17 |
| X5Y | −6.8487678e−15 | −2.7528009e−16 | 4.0675908e−17 |
| X4Y2 | −3.4859387e−15 | 2.1281811e−15 | −3.2099354e−17 |
| X3Y3 | −1.7279599e−15 | 2.4960037e−18 | 1.3268892e−17 |
| X2Y4 | −7.4219257e−16 | 1.6426744e−15 | 2.0057957e−17 |
| XY5 | −7.1024385e−17 | 8.6199705e−16 | −2.1537122e−17 |
| Y6 | −5.9080464e−17 | 3.0185584e−16 | 7.0315808e−18 |

TABLE 3b-continued

| Coefficient | M4 | M5 | M6 |
|---|---|---|---|
| X7 | 3.5338591e−17 | −2.1840832e−18 | −7.0950136e−21 |
| X6Y | −6.4585653e−17 | 8.0693674e−18 | −1.8775513e−20 |
| X5Y2 | −8.9619875e−17 | −7.1711477e−18 | −1.7829094e−21 |
| X4Y3 | −3.7588002e−17 | 7.3344820e−18 | −7.2727713e−20 |
| X3Y4 | −7.6068348e−18 | −3.2296479e−18 | −3.6836285e−20 |
| X2Y5 | −5.1827598e−19 | 1.7329676e−18 | −4.0805202e−20 |
| XY6 | 1.4725458e−19 | −6.5306000e−19 | 3.5559196e−21 |
| Y7 | −1.4432459e−20 | 4.3444774e−19 | −1.5816986e−22 |
| X8 | 3.8107526e−19 | −8.2626277e−21 | 5.1543330e−23 |
| X7Y | 8.6198715e−19 | 3.2053045e−20 | −2.1218570e−22 |
| X6Y2 | 9.3778937e−20 | −7.3021573e−20 | 2.7118099e−22 |
| X5Y3 | −9.4069713e−20 | 2.9933251e−20 | −2.6310380e−22 |
| X4Y4 | −1.3213626e−20 | −5.9595523e−20 | 2.5056093e−24 |
| X3Y5 | 2.9980985e−20 | 2.2651387e−21 | −1.4142760e−22 |
| X2Y6 | 7.0871395e−21 | −2.5784850e−20 | −9.4592234e−23 |
| XY7 | 8.8225536e−22 | −2.3383368e−22 | 9.3020100e−23 |
| Y8 | 4.9269306e−22 | −4.2922579e−21 | 5.9174451e−24 |
| X9 | 7.2587806e−22 | −2.5389727e−23 | −1.1768981e−25 |
| X8Y | 2.6804650e−21 | 1.3296168e−23 | 2.5604395e−26 |
| X7Y2 | 7.3828243e−23 | −1.5514297e−22 | −8.9491910e−25 |
| X6Y3 | −8.3774096e−22 | 7.6212361e−24 | 5.9345172e−25 |
| X5Y4 | −3.2041644e−22 | −4.1312559e−23 | −4.9919093e−25 |
| X4Y5 | −1.7289215e−22 | 2.2564517e−23 | 1.1978624e−24 |
| X3Y6 | 1.2239484e−23 | −4.3342887e−24 | −5.5320845e−25 |
| X2Y7 | −1.2424610e−23 | 1.0942726e−23 | 3.7208741e−25 |
| XY8 | 8.1918056e−26 | 1.1638455e−23 | −1.0227747e−25 |
| Y9 | 7.2627769e−25 | −6.3798141e−26 | −2.8792617e−26 |
| X10 | −1.4816945e−23 | 3.9248408e−26 | −2.7202993e−28 |
| X9Y | −1.7171642e−24 | −3.1554260e−25 | −6.3889862e−28 |
| X8Y2 | 8.8639860e−24 | 4.4904114e−25 | −1.3367716e−27 |
| X7Y3 | 7.3972005e−24 | 1.3655930e−25 | 5.2669713e−28 |
| X6Y4 | 3.2602910e−24 | 1.0978122e−24 | −1.1068600e−27 |
| X5Y5 | 3.6409604e−24 | 3.4511721e−25 | 1.3432774e−27 |
| X4Y6 | 7.8607032e−25 | 6.9547820e−25 | 4.1275809e−28 |
| X3Y7 | 1.0362932e−25 | 1.9354752e−25 | 4.5936739e−28 |
| X2Y8 | 3.3799267e−26 | 3.4365460e−25 | −5.2854950e−28 |
| XY9 | 1.3347505e−26 | 1.4817817e−26 | −4.4885497e−29 |
| Y10 | 1.8094176e−27 | 5.0461065e−26 | −3.6121608e−28 |

The mirrors M1 to M5 each have no passage opening for the illumination light 3.

In sections, the mirrors M3 and M6 are situated back-to-back.

Figure 10:
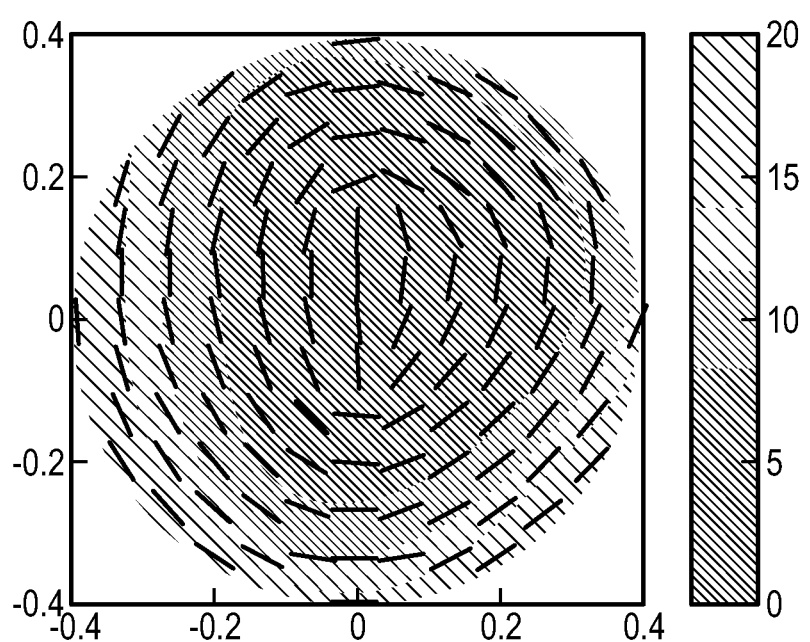
FIG. 10 shows, in an illustration similar to FIG. 4, a dependence of a diattenuation on imaging light, which illuminates a central image field point, depending on the illumination angle at the imaging optical unit according to FIGS. 7 to 9.
Figure 11:
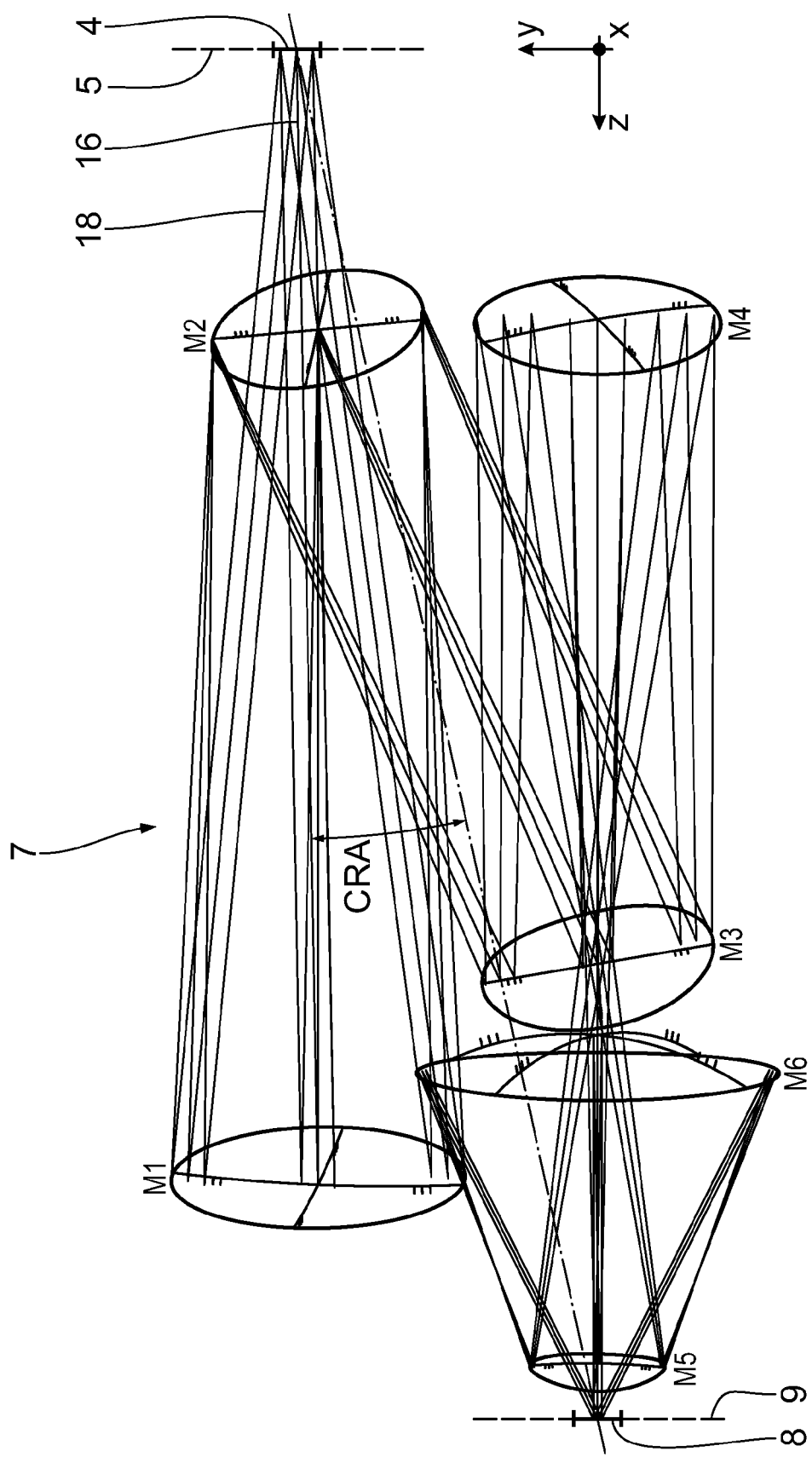
FIGS. 11 and 12 show two side views of the imaging optical unit according to FIGS. 7 to 9.
Figure 12:
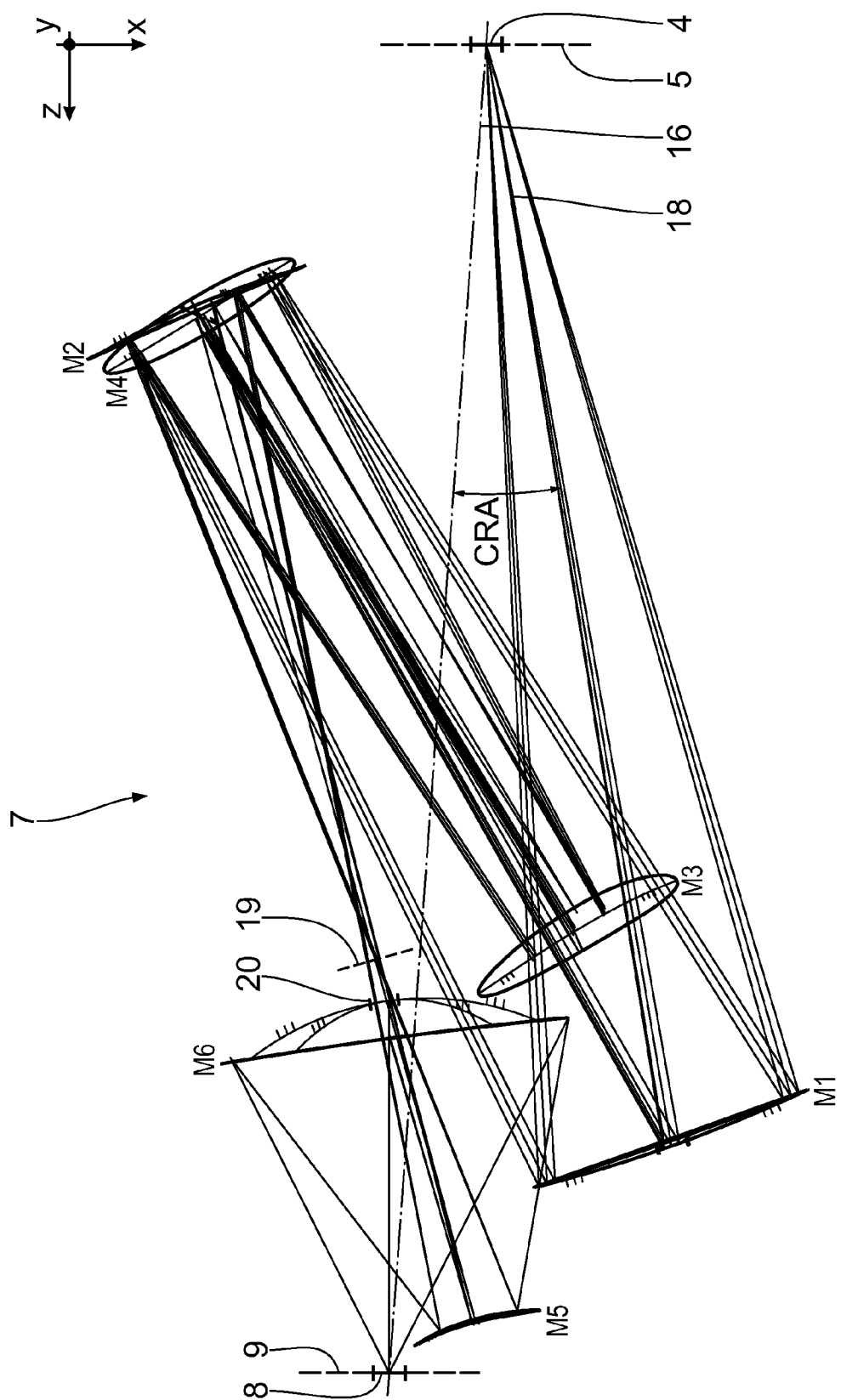

FIG. 10 shows the resultant diattenuation for the whole imaging optical unit 7 according to FIGS. 7 to 12. Apart from the largest illumination angles, there is, overall, a very small diattenuation, which is practically vanishing for a majority of the illumination angles. The diattenuation is in each case less than 20% in the region of the observed pupil coordinates.

In order to produce a micro- or nano-structured component, in particular a semiconductor component in the form of a microchip, in particular a memory chip, the projection exposure apparatus 1 is used as follows: initially the reflection mask 10 and the substrate 12 are provided. A structure on the reticle 10 is subsequently projected onto a light-sensitive layer of the wafer 12 with the aid of the projection exposure apparatus 1. A micro- or nano-structure is then produced on the wafer 12 and hence the micro-structured component is produced by developing the light-sensitive layer.

The invention claimed is:
1. An imaging optical unit, comprising:
  a plurality of mirrors configured so that, during use of the imaging optical unit, the plurality of mirrors images an object field in an object plane into an image field in an image plane,
  wherein:
    the plurality of mirrors comprises first, second, third and fourth mirrors;

a first chief ray plane is defined by propagation of a chief ray of a central object field point during reflection at the first mirror;
a second chief ray plane is defined by propagation of the chief ray of the central object field point during the reflection at the second mirror;
the first and second chief ray planes define an angle that differs from 0; and
the imaging optical unit is an imaging catoptric EUV projection optical unit.

2. The imaging optical unit of claim 1, wherein the first chief ray plane is perpendicular to the second chief ray plane.

3. The imaging optical unit of claim 2, wherein the imaging optical unit has precisely two chief ray planes.

4. The imaging optical unit of claim 3, wherein the imaging optical unit has an intermediate image in an imaging beam path between the object field and the image field.

5. The imaging optical unit of claim 1, wherein the imaging optical unit has precisely two chief ray planes.

6. The imaging optical unit of claim 5, wherein the imaging optical unit has an intermediate image in an imaging beam path between the object field and the image field.

7. The imaging optical unit of claim 1, wherein the imaging optical unit has an intermediate image in an imaging beam path between the object field and the image field.

8. The imaging optical unit of claim 7, wherein the first chief ray plane is perpendicular to the second chief ray plane.

9. An illumination system, comprising:
an illumination optical unit; and
an imaging optical unit according to claim 1,
wherein the illumination optical unit is configured to illuminate the object field.

10. An apparatus, comprising:
a light source; and
an illumination system which comprises:
an illumination optical unit; and
an imaging optical unit according to claim 1,
wherein the illumination optical unit is configured to illuminate the object field with light generated by the light source, and the apparatus is a projection exposure apparatus.

11. A method of using a microlithographic projection exposure apparatus comprising an illumination optical unit and an imaging optical unit, the method comprising:
using the illumination optical unit to illuminate a reticle comprising structures; and
using the imaging optical unit to project a portion of the reticle onto a light-sensitive material,
wherein the imaging optical unit comprises an imaging optical unit according to claim 1.

12. The imaging optical unit of claim 1, wherein:
the imaging optical unit has an image-side numerical aperture of at least 0.4;
considered via the image field, the imaging optical unit has a diattenuation for a specific illumination angle; and
the diattenuation attenuating imaging light polarized tangentially to the center of a pupil of the optical imaging unit to a lesser extent than imaging light polarized perpendicularly thereto.

13. An illumination system, comprising:
an illumination optical unit; and
an imaging optical unit according to claim 12,
wherein the illumination optical unit is configured to illuminate the object field.

14. An apparatus, comprising:
a light source; and
an illumination system which comprises:
an illumination optical unit; and
an imaging optical unit according to claim 12,
wherein the illumination optical unit is configured to illuminate the object field with light generated by the light source, and the apparatus is a projection exposure apparatus.

15. A method of using a microlithographic projection exposure apparatus comprising an illumination optical unit and an imaging optical unit, the method comprising:
using the illumination optical unit to illuminate a reticle comprising structures; and
using the imaging optical unit to project a portion of the reticle onto a light-sensitive material,
wherein the imaging optical unit comprises an imaging optical unit according to claim 12.

16. An imaging optical unit, comprising:
at least four mirrors configured so that, during use of the imaging optical unit, the at least four mirrors image an object field in an object plane into an image field in an image plane,
wherein:
the imaging optical unit has an image-side numerical aperture of at least 0.4;
considered via the image field, the imaging optical unit has a maximum diattenuation of 10% for a specific, respectively considered illumination angle; and
the imaging optical unit is an imaging catoptric optical unit.

17. The imaging optical unit of claim 16, wherein, considered over the image field, the imaging optical unit has a maximum diattenuation of 20% for all pupil coordinates.

18. An illumination system, comprising:
an illumination optical unit; and
an imaging optical unit according to claim 16,
wherein the illumination optical unit is configured to illuminate the object field.

19. An apparatus, comprising:
a light source; and
an illumination system which comprises:
an illumination optical unit; and
an imaging optical unit according to claim 16,
wherein the illumination optical unit is configured to illuminate the object field with light generated by the light source, and the apparatus is a projection exposure apparatus.

20. A method of using a microlithographic projection exposure apparatus comprising an illumination optical unit and an imaging optical unit, the method comprising:
using the illumination optical unit to illuminate a reticle comprising structures; and
using the imaging optical unit to project a portion of the reticle onto a light-sensitive material,
wherein the imaging optical unit comprises an imaging optical unit according to claim 16.

* * * * *

UNITED STATES PATENT AND TRADEMARK OFFICE
CERTIFICATE OF CORRECTION

PATENT NO. : 9,639,005 B2  
APPLICATION NO. : 14/179692  
DATED : May 2, 2017  
INVENTOR(S) : Johannes Ruoff and Thomas Schicketanz Page 1 of 1

It is certified that error appears in the above-identified patent and that said Letters Patent is hereby corrected as shown below:

In the Specification

Column 1, Line 12, delete "PCT/EP2012/054664" and insert -- PCT/EP2012/069158 --.

Column 7, Line 5, delete "$b_x^2 \, b_y^2$" and insert -- $b_x^2 + b_y^2$ --.

Signed and Sealed this  
Seventeenth Day of October, 2017

Joseph Matal  
*Performing the Functions and Duties of the*  
*Under Secretary of Commerce for Intellectual Property and*  
*Director of the United States Patent and Trademark Office*